US010003305B2

United States Patent
Park et al.

(10) Patent No.: US 10,003,305 B2
(45) Date of Patent: Jun. 19, 2018

(54) APPARATUS AND METHOD FOR MODULATING SUPPLY FOR A POWER AMPLIFIER

(71) Applicant: Samsung Electronics Co. Ltd.

(72) Inventors: Bok-Ju Park, Suwon-si (KR); Dong-Ki Kim, Seoul (KR); Ji-Seon Paek, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 555 days.

(21) Appl. No.: 13/651,948

(22) Filed: Oct. 15, 2012

(65) Prior Publication Data
US 2013/0093247 A1     Apr. 18, 2013

(30) Foreign Application Priority Data

Oct. 14, 2011 (KR) .................. 10-2011-0105554

(51) Int. Cl.
    *H02J 1/00*    (2006.01)
    *H03F 1/02*    (2006.01)
    *H03F 3/217*    (2006.01)

(52) U.S. Cl.
CPC .......... *H03F 1/0227* (2013.01); *H03F 3/217* (2013.01); *H03F 2200/432* (2013.01); *Y10T 307/675* (2015.04)

(58) Field of Classification Search
CPC .......... H02J 1/00; H03F 1/0227; H03F 3/217; H03F 2200/432; Y10T 307/675
(Continued)

(56) References Cited

U.S. PATENT DOCUMENTS

| 5,309,082 A | 5/1994 | Payne |
| 7,170,197 B2 * | 1/2007 | Lopata ................ G06F 1/263 |
| | | 307/70 |

(Continued)

FOREIGN PATENT DOCUMENTS

| CN | 101867284 A | 10/2010 |
| EP | 2 214 304 A1 | 8/2010 |

(Continued)

OTHER PUBLICATIONS

J.T.S. et al. 'Optimum Biasing for Parallel Hybrid Switching-Linear Regulators', In: IEEE Transactions on Power Electronics, vol. 22, No. 5, Sep. 2007, pp. 1978-1985.

(Continued)

*Primary Examiner* — Daniel Kessie
(74) *Attorney, Agent, or Firm* — Jefferson IP Law, LLP

(57) ABSTRACT

An apparatus and method for improving the efficiency of a power supply modulator for modulating a supply voltage of a power amplifier are provided. The apparatus for generating a supply voltage includes a Switching Mode Power Supplier (SMPS) module for generating a current of a power supply signal, and a linear regulator for generating a source current for supplementing an insufficient amount of the current generated by the SMPS module and a sink current for eliminating an excessive amount of the current generated by the SMPS module. The SMPS module generates the current of the power supply signal by selecting at least one of a plurality of power supplies that have different voltages according to a voltage level of an input signal of the SMPS module.

17 Claims, 8 Drawing Sheets

(58) Field of Classification Search
USPC .......................................................... 307/75
See application file for complete search history.

(56) References Cited

U.S. PATENT DOCUMENTS

| | | | | |
|---|---|---|---|---|
| 7,538,631 | B2* | 5/2009 | Immonen | H03F 1/0205 332/149 |
| 7,653,366 | B2* | 1/2010 | Grigore | H03C 5/00 323/268 |
| 7,948,720 | B2* | 5/2011 | Mok | H02M 3/156 323/272 |
| 7,994,761 | B2* | 8/2011 | Markowski | G05F 1/618 323/270 |
| 8,897,724 | B2* | 11/2014 | Hou | H03F 1/025 455/127.1 |
| 2002/0130645 | A1* | 9/2002 | Tsai | G05F 1/24 323/274 |
| 2003/0210021 | A1* | 11/2003 | Silic | H02M 3/155 323/282 |
| 2005/0052170 | A1* | 3/2005 | Kim | H02M 3/07 323/282 |
| 2005/0215209 | A1* | 9/2005 | Tanabe | H03F 1/0211 455/127.1 |
| 2007/0210774 | A1* | 9/2007 | Kimura | H02M 1/36 323/282 |
| 2009/0289720 | A1* | 11/2009 | Takinami | G05F 1/565 330/297 |
| 2010/0171553 | A1 | 7/2010 | Okubo et al. | |
| 2011/0241775 | A1* | 10/2011 | Kunihiro | H03F 1/0222 330/127 |
| 2013/0078939 | A1 | 3/2013 | Hou | |

FOREIGN PATENT DOCUMENTS

| | | |
|---|---|---|
| EP | 2 214 305 A1 | 8/2010 |
| EP | 2 302 788 A1 | 3/2011 |
| KR | 20120050577 A | 5/2012 |

OTHER PUBLICATIONS

J.C. et al. 'A Polar Transmitter With CMOS Programmable Hysteretic-Controlled Hybrid Switching Supply Modulator for Multistandard Applications', In: IEEE Transactions on Microwave Theory and Techniques, vol. 57, No. 7, Jul. 2009, pp. 1675-1686.

G.H. et al. 'High-Efficiency Power Amplifier Using Dynamic Power-Supply Voltage for CDMA Applications', In: IEEE Transactions on Microwave Theory and Techniques, vol. 47, No. 8, Aug. 1999, pp. 1471-1476.

J.S.W. et al. 'Linearizing CMOS Switching Power Amplifiers Using Supply Regulators', In: IEEE Transactions on Circuits and Systems II: Express Briefs, vol. 57, No. 7, Jul. 2010, pp. 497-501.

Yousefzadeh V et al., Efficiency Optimization in Linear-Assisted Switching Power Converters for Envelope Tracking in RF Power Amplifiers, Conference Proceedings / IEEE International Symposium on Circuits and Systems (ISCAS), May 23, 2005, XP010815776, DOI: 10.1109/ISCAS.2005.1464834.

Walker G R, A Class B Switch-Mode Assisted Linear Amplifier, IEEE Transactions on Power Electronics, Nov. 1, 2003, vol. 18, No. 6, XP011103195, ISSN: 0885-8993, DOI: 10.1109/TPEL.2003.818825.

Korean Notice of Preliminary Rejection corresponding to Korean Patent Application No. KR10-2011-0105554 dated Mar. 30, 2017.

* cited by examiner

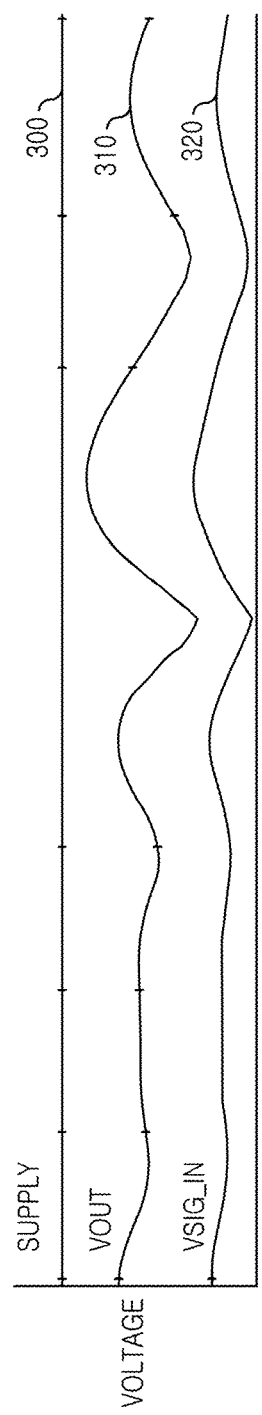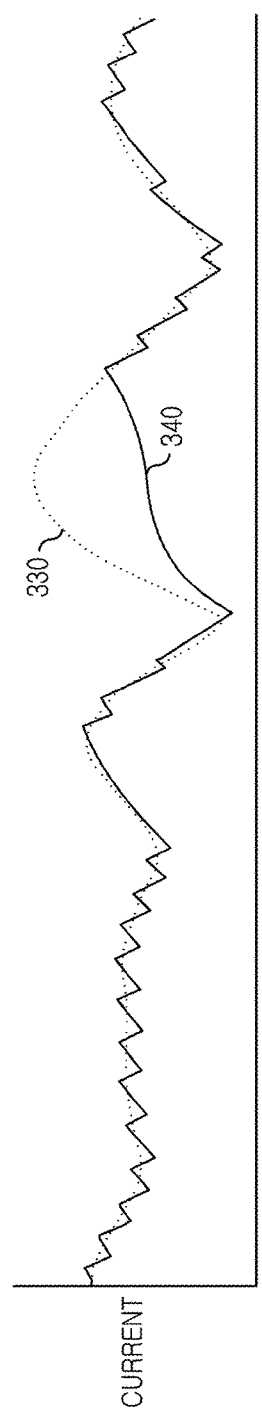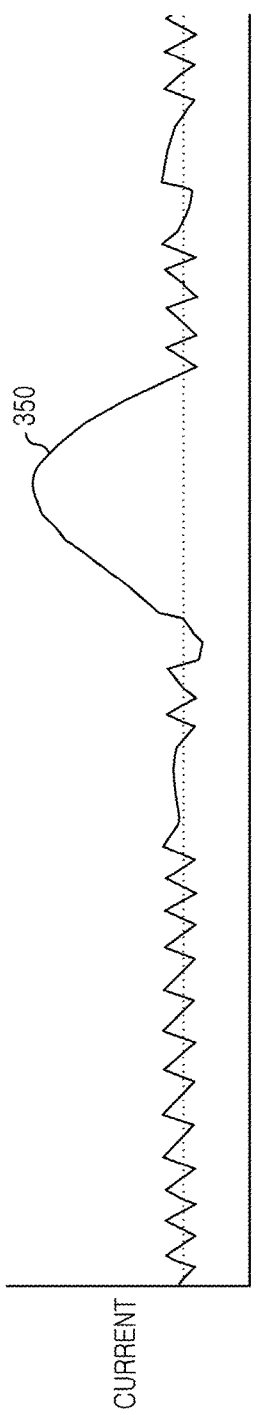

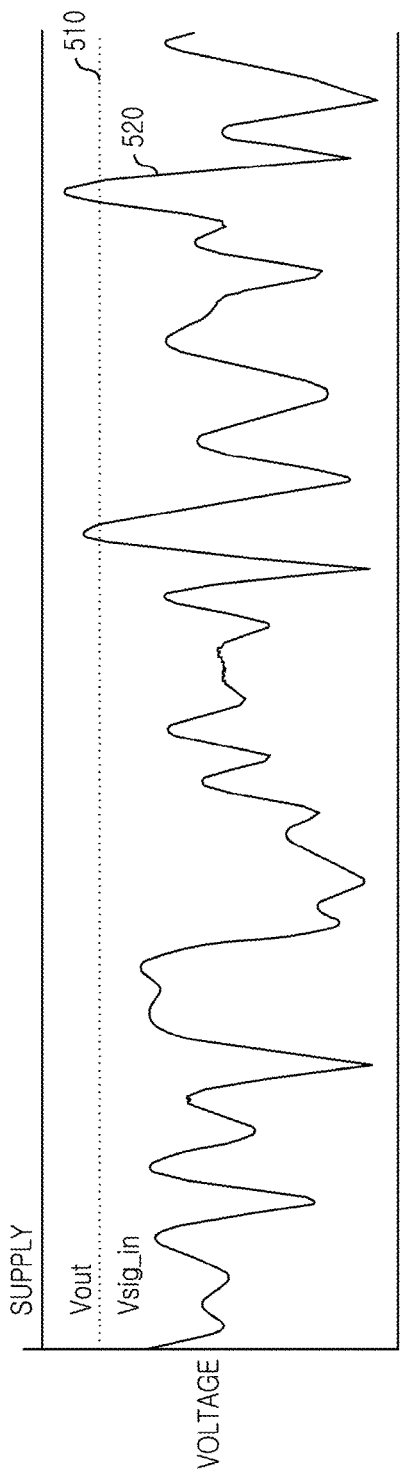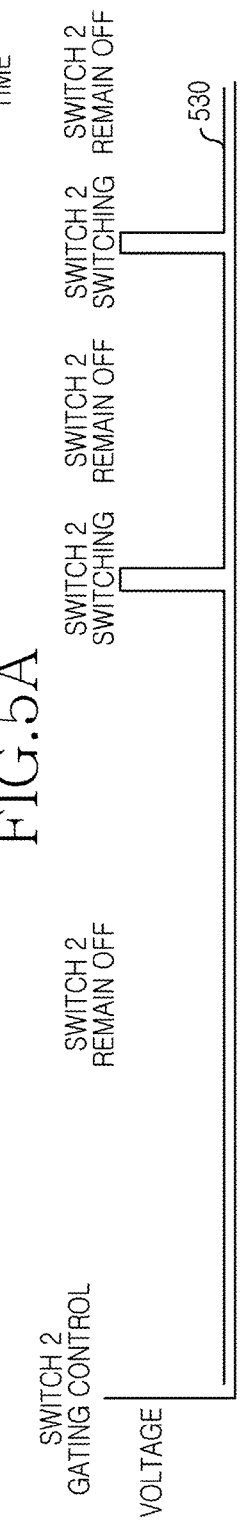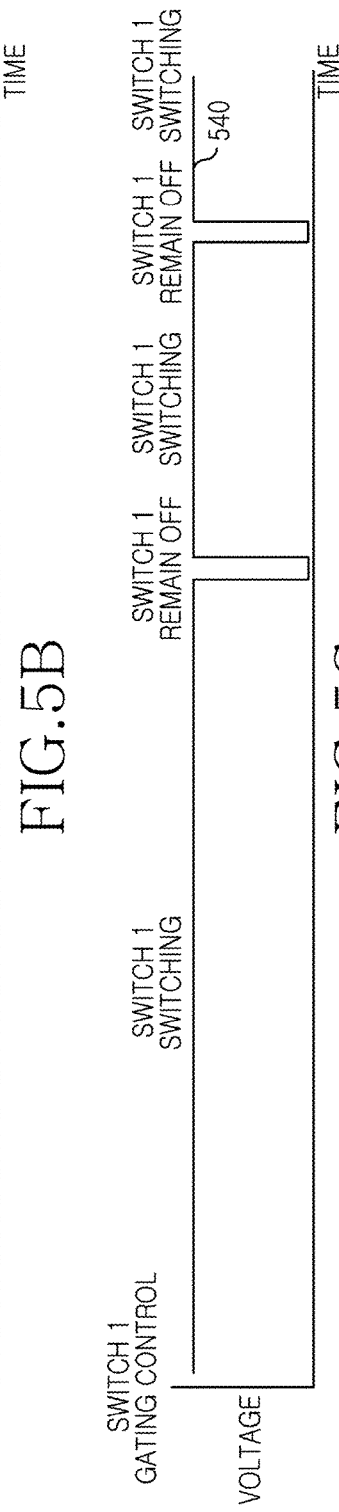

APPARATUS AND METHOD FOR MODULATING SUPPLY FOR A POWER AMPLIFIER

PRIORITY

This application claims priority under 35 U.S.C. § 119(a) of a Korean patent application filed on Oct. 14, 2011 in the Korean Intellectual Property Office and assigned Serial No. 10-2011-0105554, the entire disclosure of which is hereby incorporated by reference.

BACKGROUND OF THE INVENTION

1. Field of the Invention

The present invention relates to an apparatus and method for generating a supply voltage for a power amplifier in a power supply modulator. More particularly, the present invention relates to an apparatus and method for improving an efficiency of the power supply modulator for modulating a supply voltage for the power amplifier.

2. Description of the Related Art

With the development of wireless communication technologies there has been an increase in consumer use of various multimedia signals, and an interest in Fourth-Generation (4G) communication systems is rapidly increasing according to the need for rapid transmission of the various multimedia signals in mobile environments.

4G communication systems provide a higher transmission rate, a wider bandwidth, and a higher Peak to Average Power Ratio (PAPR) than other communication systems, for example, 3rd Generation (3G) communication systems. 4G communication systems use a power supply modulation amplifier that amplifies an input signal by using a supply voltage that is modulated according to an amplitude of the input signal. For example, the power supply modulation amplifier may use an Envelope Elimination and Restoration (EER) amplification technique, an Envelope Tracking (ET) amplification technique, a polar amplification technique, or any other similar and/or suitable amplification technique.

FIG. 1 illustrates a block configuration of a power supply modulation amplifier according to the related art.

Referring to FIG. 1, when the ET amplification technique is used, the power supply modulation amplifier is configured as illustrated in FIG. 1. A Related art power supply modulation amplifier includes a baseband signal processor 100, a power supply modulator 110, a Radio Frequency (RF) processor 120, and a power amplifier 130. The baseband signal processor 100 generates and outputs In-phase Quadrature (IQ) data. The RF processor 120 converts the IQ data received from the baseband signal processor 100 into an RF signal, and provides the RF signal as an input signal of the power amplifier 130.

The power supply modulator 110 determines a supply voltage of the power amplifier 130 according to an envelope corresponding to the IQ data received from the baseband signal processor 100. That is, the power supply modulator 110 generates the supply voltage based on an amplitude of a signal inputted to the baseband signal processor 100. The power amplifier 130 amplifies the input signal received from the RF processor 120 by using the supply voltage received from the power supply modulator 110 and then outputs the amplified input signal.

As described above, when the power supply modulation amplifier amplifies the input signal by using the supply voltage modulated according to the amplitude of the input signal, an envelope of an RF output signal of the power supply modulation amplifier is determined by the supply voltage modulated according to the amplitude of the input signal. Thus, the linear modulation performance of the power supply modulator 110 directly affects the quality of the RF output signal.

Therefore, there is a need for a communication system having a power supply modulator with a good linear modulation performance in order to increase the power amplification efficiency of the power supply modulation amplifier.

SUMMARY OF THE INVENTION

Aspects of the present invention are to address at least the above-mentioned problems and/or disadvantages and to provide at least the advantages described below. Accordingly, an aspect of the present invention is to provide an apparatus and method for improving the power amplification efficiency of a power supply modulation amplifier.

Another aspect of the present invention is to provide an apparatus and method for improving a linear modulation efficiency of a power supply modulator.

Another aspect of the present invention is to provide an apparatus and method for improving a linear modulation efficiency of a hybrid power supply modulator.

Another aspect of the present invention is to provide an apparatus and method for efficiently modulating a supply voltage of a power amplifier in a hybrid power supply modulator according to an amplitude of a high-Peak to Average Power Ratio (PAPR) signal.

Another aspect of the present invention is to provide an apparatus and method for efficiently generating a supply current of a power amplifier in a Switching Mode Power Supplier (SMPS) of a hybrid power supply modulator according to an amplitude of a high-PAPR signal.

Another aspect of the present invention is to provide an apparatus and method for efficiently modulating a supply voltage of a power amplifier in a hybrid power supply modulator by using two or more power supplies.

Another aspect of the present invention is to provide an apparatus and method for efficiently modulating a supply voltage of a power amplifier in an SMPS of a hybrid power supply modulator by at least two power supplies.

In accordance with an aspect of the present invention, an apparatus for power supply modulation is provided. The apparatus includes an SMPS module for generating a current of a power supply signal, and a linear regulator for generating a source current for supplementing an insufficient amount of the current generated by the SMPS module and a sink current for eliminating an excessive amount of the current generated by the SMPS module, wherein the SMPS module generates the current of the power supply signal by selecting at least one of a plurality of power supplies that have different voltages according to a voltage level of an input signal of the SMPS module.

In accordance with another aspect of the present invention, a method for generating a supply voltage in a power supply modulator including an SMPS module and a linear regulator is provided. The method includes detecting a voltage of an input signal of the SMPS module, selecting at least one of a plurality of power supplies that have different voltages included in the SMPS module according to a voltage level of the input signal of the SMPS module, and generating a current for a power amplifier by using the selected power supply, wherein the SMPS module generates a current of a modulated power supply signal is generated by the SMPS module, and a source current for supplementing an insufficient amount of the current generated by the SMPS module and a sink current for eliminating an excessive amount of the current generated by the SMPS module are generated by the linear regulator.

In accordance with another aspect of the present invention, an apparatus for power supply modulation is provided. The apparatus includes an SMPS module for generating a current of a power supply signal, the SMPS module including a driver for controlling a plurality of switch transistors according to an input signal, a plurality of switch transistors for regulating a current amount under the control of the driver, and a filter for filtering a signal having passed through the switch transistors, and a linear regulator including a plurality of transistors and an amplifier for regulating a current amount generated by the transistors, wherein the linear regulator regulates the current amount generated by the transistors by at least one of generating a source current for supplementing an insufficient amount of the current generated by the SMPS module by using a first transistor from among the plurality of transistors and generating a sink current for eliminating an excessive amount of the current generated by the SMPS module by using a second transistor from among the plurality of transistors, and wherein the SMPS module generates the current of the power supply signal by selecting at least one of a plurality of power supplies, each of the power supplies having different voltages according to a voltage level of the input signal of the SMPS module.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following detailed description when taken in conjunction with the accompanying drawings, in which:

FIGS. 3A to 3C are diagrams illustrating a supply voltage of a hybrid power supply amplifier according to an exemplary embodiment of the present invention;

FIGS. 5A to 5C are diagrams illustrating an output signal of a detector according to an exemplary embodiment of the present invention;

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and configurations may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, according to exemplary embodiments, a method for improving an efficiency of a power supply modulator for modulating a supply voltage of a power amplifier is described. In the following description, it is assumed that a supply voltage of a power amplifier is generated by using a hybrid power supply modulator, which includes a linear regulator and a Switching Mode Power Supplier (SMPS), in order to improve a linear modulation efficiency of a power supply modulator.

Figure 1:
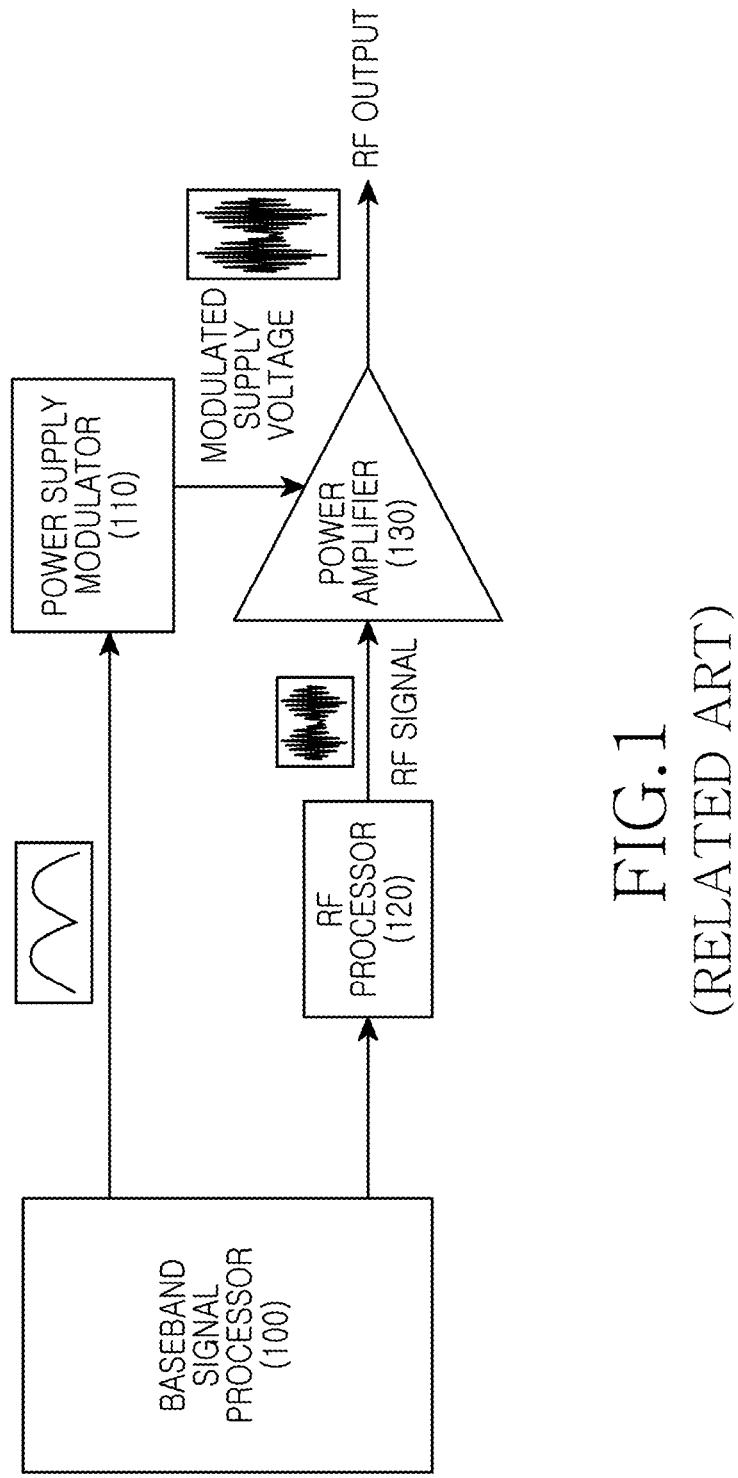
FIG. 1 is a diagram illustrating a block configuration of a power supply modulation amplifier according to the related art.
Figure 2:
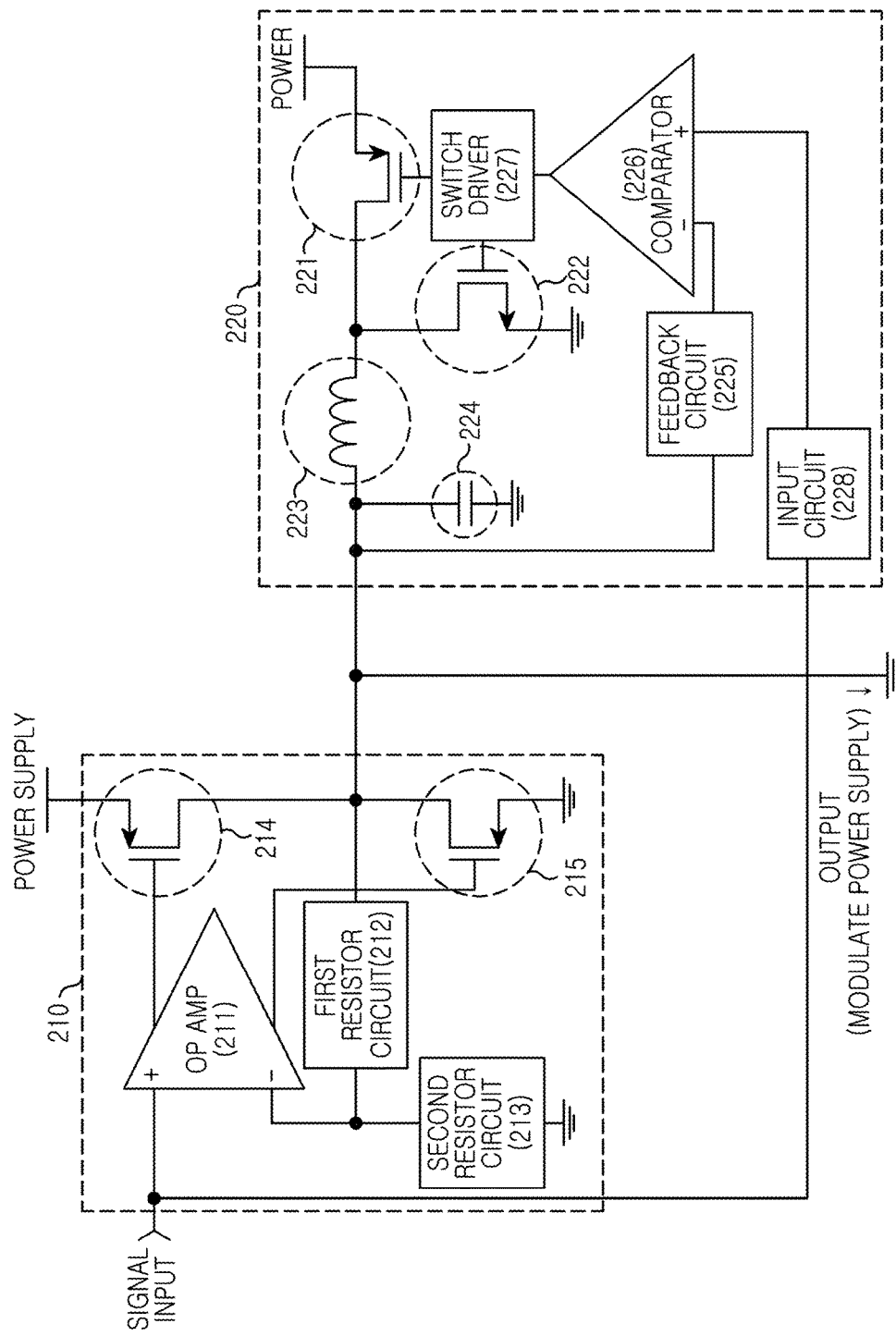
FIG. 2 is a diagram illustrating a block configuration of a hybrid power supply modulator according to an exemplary embodiment of the present invention.

FIG. 2 illustrates a block configuration of a hybrid power supply modulator according to an exemplary embodiment of the present invention.

Referring to FIG. 2, the hybrid power supply modulator includes a linear regulator 210 and an SMPS module 220. The hybrid power supply modulator provides the same input signal to the linear regulator 210 and to the SMPS module 220, and combines an output of the linear regulator 210 and an output of the SMPS module 220 to be an output provided to a power amplifier. Herein, each of the linear regulator 210 and the SMPS module 220 includes a feedback loop for receiving a feedback of an output of the power supply modulator as a control input.

The linear regulator 210 includes an Operational Amplifier (OP AMP) 211, a first resistor circuit 212, wherein a resistor circuit may be a resistor network, a second resistor circuit 213, a high pass transistor 214, and a low pass transistor 215. Herein, the high pass transistor 214 may be a P-channel Metal-Oxide-Semiconductor (PMOS) transistor that has a source connected to a power supply, a gate connected to the OP AMP 211, and a drain connected to an output terminal of the regulator 210. The low pass transistor 215 may be an N-channel Metal-Oxide-Semiconductor (NMOS) transistor that has a drain connected to the output terminal of the regulator 210, a gate connected to the OP AMP 211, and a source connected to a ground terminal.

The linear regulator 210 linearly converts an input voltage signal by regulating output voltages of the high pass transistor 214 and the low pass transistor 215 through a feedback loop according to an input signal inputted to the OP AMP 211. The feedback loop may include the first resistor circuit 212 and the second resistor circuit 213.

The SMPS module 220 includes an upper switch 221, a lower switch 222, an inductor 223, a capacitor 224, a feedback circuit 225, a comparator 226, a switch driver 227, and an input circuit 228. Herein, the upper switch 221 may be a PMOS transistor that has a source connected to a power supply, a gate connected to the switch driver 227, and a drain connected to the inductor 223. The lower switch 222 may be an NMOS transistor that has a drain connected to the inductor 223, a gate connected to the switch driver 227, and a source connected a ground terminal. The SMPS module 220 controls an on-off duty ratio or a switching frequency of the upper switch 221 and the lower switch 222 in order to regulate an amount of a current supplied to the power amplifier.

The switch driver 227 controls the upper switch 221 and the lower switch 222 according to a comparison between voltages of the output signal of the SMPS module 220 received through the comparator 226 and the input signal of the SMPS module 220. In other words, in a case where the output signal of the SMPS module 220 is larger than the input signal, the switch driver 227 turns off the upper switch 221 and turns on the lower switch 222 in order to reduce the current of the output signal of the switch driver 227. On the other hand, in a case where the output signal of the SMPS module 220 is smaller than the input signal, the switch driver 227 turns on the upper switch 221 and turns off the lower switch 222 in order to increase the current of the output signal of the switch driver 227.

The comparator 226 provides the switch driver 227 with information about the comparison between the voltages of the output signal of the SMPS module 220 received through the feedback circuit 225 and the input signal of the SMPS module 220 received through the input circuit 228. Herein, the input circuit 228 converts, i.e., equalizes, the voltage of the input signal such that a voltage level of the output signal of the SMPS module 220 is equalized to a voltage level of the input signal of the SMPS module 220.

A current supplied through the upper switch 221 and the lower switch 222 to the power amplifier may be filtered by a Low-Pass Filter (LPF) that is connected to the output terminal. Herein, the LPF may include the inductor 223 and the capacitor 224. The SMPS module 220 controls the filtering by the LPF such that the output current resembles the voltage of the input signal. That is, the SMPS module 220 supplies most of the current necessary in the power amplifier, corresponding to an output voltage waveform of the power supply modulator. Herein, a Pulse Frequency Modulation (PFM) signal and a Pulse Width Modulation (PWM) signal are generated by the upper switch 221 and the lower switch 222. A signal supplied through the upper switch 221 and the lower switch 222 to the power amplifier may be filtered by the Low-Pass Filter (LPF) connected to the output terminal. The final output current of the SMPS module 220 is controlled so as to resemble an input voltage signal. That is, the SMPS module 220 supplies most of the current necessary in the power amplifier, and such current is supplied in a manner corresponding to the output voltage waveform.

In the hybrid power supply modulator, the SMPS module 220 may fail to supply a portion of the current used by the power amplifier, or may supply a current exceeding the current used by the power amplifier. In such a case, the linear regulator 210 may receive an inefficient current from the SMPS module 220, or may sink an excessive amount of the output current of the SMPS module 220. Accordingly, the linear regulator 210 may have a complementary push-pull structure using the high pass transistor 214 and the low pass transistor 215.

When the hybrid power supply modulator modulates the supply voltage of the power amplifier according to a broadband input signal that includes an RF component, the SMPS module 220 may fail to smoothly supply an RF current component due to the narrowband characteristics by the filtering and the switching operation. That is, the SMPS module 220 may fail to supply a portion of the current used by the power amplifier that amplifies the broadband input signal.

The portion of the current that is not supplied to the power amplifier by the SMPS module 220 may be supplemented through the output of the linear regulator 210 that shares the output terminal of the power supply modulator. That is, a supplementary current component outputted by the linear regulator 210 may be added to the supply current outputted from the SMPS module 220. Accordingly, the final output current of the power supply modulator is generated.

FIGS. 3A to 3C illustrate a supply voltage of a hybrid power supply amplifier according to an exemplary embodiment of the present invention.

Referring to FIGS. 3A to 3C, the linear regulator 210 and the SMPS module 220 of the power supply modulator may output a current as illustrated in FIGS. 3A to 3C. Specifically, FIG. 3A illustrates an output voltage and a voltage of an input signal of the hybrid power supply modulator, FIG. 3B illustrates an output current of the SMPS 220 of the hybrid power supply modulator, and FIG. 3C illustrates an output current of the linear regulator 210 of the hybrid power supply modulator.

As illustrated in FIG. 3A, the hybrid power supply modulator generates a supply voltage 310 of the power amplifier by using a fixed power supply 300 according to a voltage 320 of the input signal. As illustrated in FIG. 3B, a current slope 340 of the hybrid power supply modulator, with respect to the SMPS 220 is lower than a change rate of the input signal. Accordingly, the SMPS module 220 may fail to supply a portion of a current 330 needed by the power amplifier in a region where a voltage of the input signal is at its peak.

The linear regulator 210 outputs a supplementary current component in order to supplement a current component that the SMPS module 220 may fail to supply to the power amplifier. Accordingly, as shown in FIG. 3C, the hybrid power supply modulator may generate a final output current 350 by combining the supplementary current component outputted by the linear regulator 210 and the supply current outputted by the SMPS module 220.

As described above, when the linear regulator 210 supplements the current component that the SMPS module 220 fails to supply to the power amplifier, the total power supply modulation efficiency of the hybrid power supply modulator may be degraded due to the low-efficiency characteristics of the linear regulator 210. Accordingly, in the hybrid power supply modulator, the SMPS module may be configured to include a plurality of power supplies having different voltage levels, as illustrated in FIG. 4, so that the SMPS module may supply most of the current used by the power amplifier.

Figure 4:
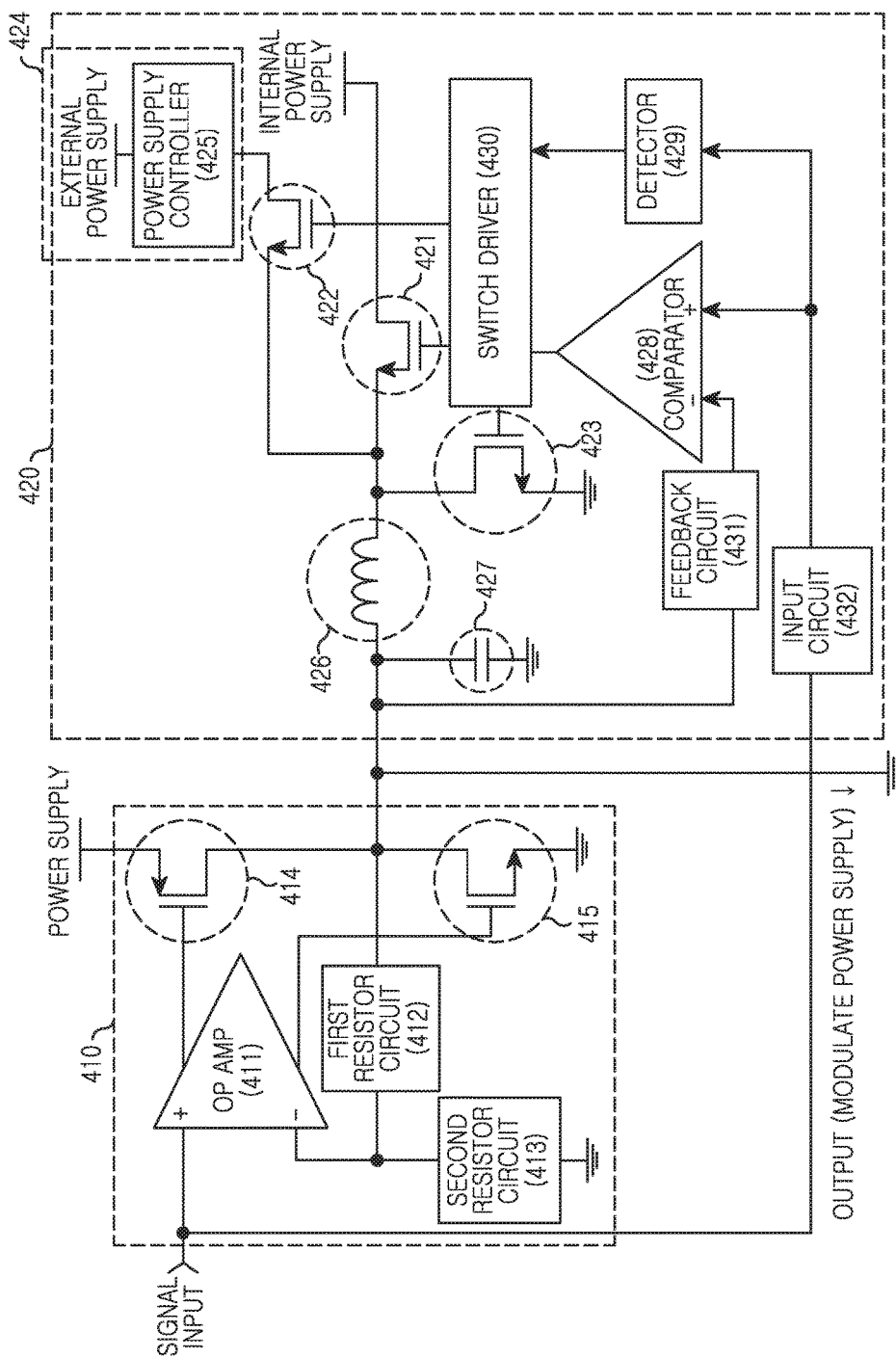
FIG. 4 is a diagram illustrating a block configuration of a hybrid power supply modulator according to another exemplary embodiment of the present invention.

FIG. 4 illustrates a block configuration of a hybrid power supply modulator according to another exemplary embodiment of the present invention.

Referring to FIG. 4, the hybrid power supply modulator includes a linear regulator 410 and an SMPS module 420. The hybrid power supply modulator inputs the same input signal to the linear regulator 410 and the SMPS module 420, and outputs a combination of an output of the linear regulator 410 and an output of the SMPS module 420 to a power amplifier. Herein, each of the linear regulator 410 and the SMPS module 420 may include a feedback loop for receiving a feedback of an output of the power supply modulator as a control input.

The linear regulator 410 linearly converts an input voltage signal by regulating output voltages of pass transistors 414 and 415 through a feedback loop according to an input signal inputted to an OP AMP 411. Herein, the feedback loop includes first and second resistor circuits 412 and 413.

The SMPS module 420 controls an on-off duty ratio, i.e., a switching frequency, of first through third switch transistors 421, 422 and 423 in order to regulate the amount of a current supplied to the power amplifier. In a case when the first switch transistor 421 is turned on under the control of a switch driver 430, the first switch transistor 421 connects an inductor 426 to an internal power supply. In a case when the second switch transistor 422 is turned on under the control of the switch driver 430, the second switch transistor 422 connects the inductor 426 to an external power supply 424. The external power supply 424 may include an internal power supply and a power supply controller 425, and may generate a voltage higher than the internal power supply connected to the inductor 426 through the first switch transistor 421. The power supply controller 425 may increase a voltage of the internal power supply prior to outputting a signal. For example, the power supply controller 425 may include a switching type DC-DC converter, a charge pump type DC-DC converter, or any other similar and/or suitable DC-DC converter.

A comparator 428 generates comparison information by comparing a voltage of the output signal of the SMPS module 420, which may be received through a feedback circuit 431, with a voltage of the input signal of the SMPS module 420, which may be received through an input circuit 432. Then, the comparator 428 outputs the comparison information to the switch driver 430. For example, in a case where the voltage of the output signal of the SMPS module 420 is higher than the voltage of the input signal of the SMPS module 420, the comparator 428 outputs HIGH comparison information to the switch driver 430. As another example, when the voltage of the output signal of the SMPS module 420 is lower than or equal to the voltage of the input signal of the SMPS module 420, the comparator 428 outputs LOW comparison information to the switch driver 430. Herein, the input circuit 432 converts, i.e., equalizes, the voltage of the input signal prior to outputting the signal such that a voltage level of the output signal of the SMPS module 420 is equalized to a voltage level of the input signal of the SMPS module 420.

A detector 429 outputs, to the switch driver 430, information for driving the second switch transistor 422 according to the voltage of the input signal of the SMPS module 420 received through the input circuit 432. Specifically, the detector 429 outputs information about a comparison between the voltage of the input signal of the SMPS module 420 and a reference voltage to the switch driver 430 so that the second switch transistor 422 is driven only when the voltage of the input signal of the SMPS module 420 is higher than the reference voltage. For example, in a case where the voltage of the input signal of the SMPS module 420 is higher than the reference voltage, the detector 429 outputs HIGH information to the switch driver 430. As another example, in a case where the voltage of the input signal of the SMPS module 420 is lower than or equal to the reference voltage, the detector 429 outputs LOW information to the switch driver 430.

FIGS. 5A to 5C are diagrams illustrating an output signal of a detector according to an exemplary embodiment of the present invention.

Referring to FIGS. 5A to 5C, if a voltage 520 of the input signal of the SMPS module 420 is higher than a reference voltage 510, as illustrated in FIG. 5A, then the detector 429 outputs HIGH information to the switch driver 420 so that the second switch transistor 422 is driven to output a voltage 530 only when the voltage 520 of the input signal of the SMPS module 420 is higher than the reference voltage 510, as illustrated in FIG. 5B. In this case, as illustrated in FIG. 5C, the first switch transistor 421 is not driven under the control of the switch driver 430 when the output of the detector 429 is high so as to output a voltage 540. Herein, the reference voltage includes a band gap.

The switch driver 430 controls the first switch transistor 421 and the second switch transistor 422 based on the comparison information received from the comparator 428 and the detector 429. Also, the switch driver 430 controls the third switch transistor 423 based on the comparison information received from the comparator 428. For example, in a case where the comparator 428 outputs HIGH information and when the detector 429 outputs LOW information, the switch driver 430 turns off the switch transistors 421, 422 and 423. As another example, when the comparator 428 and the detector 429 output HIGH information, the switch driver 430 turns off the switch transistors 421, 422 and 423. As yet another example, when the comparator 428 outputs LOW information and when the detector 429 outputs HIGH information, the switch driver 430 turns off the first transistor 421 and turns on both the second switch transistor 422 and the third switch transistor 423. As yet another example, when the comparator 428 and the detector 429 output LOW information, the switch driver 430 turns off the second transistor 422 and turns on both the first switch transistor 421 and the third switch transistor 423. Although not illustrated, the switch driver 430 may further include a driver buffer in order to appropriately operate a gate of each of the switch transistors according to the sizes of the switch transistors 421, 422 and 423.

A current supplied through the switch transistors 421, 422 and 423 to the power amplifier is filtered by an LPF connected to the output terminal. The SMPS module 420 controls the filtering by the LPF such that the output current resembles the voltage of the input signal. That is, the SMPS module 420 supplies most of the current needed in the power amplifier in a manner corresponding to an output voltage waveform of the power supply modulator. Herein, the LPF may include the inductor 426 and a capacitor 427.

In the above exemplary embodiment of the present invention, another internal power supply connected to the inductor 426 by the first switch transistor 421 and the internal power supply included in the external power supply 424 may be identical to or different from each other. As described above, the SMPS module 420 of the hybrid power supply modulator supplies most of the current needed in the power amplifier, by selectively using the internal power supply and the external power supply 424 under the control of the switch driver 420.

FIGS. 6A to 6D are diagrams illustrating an output signal of a switch driver according to an exemplary embodiment of the present invention.

Figure 6A:
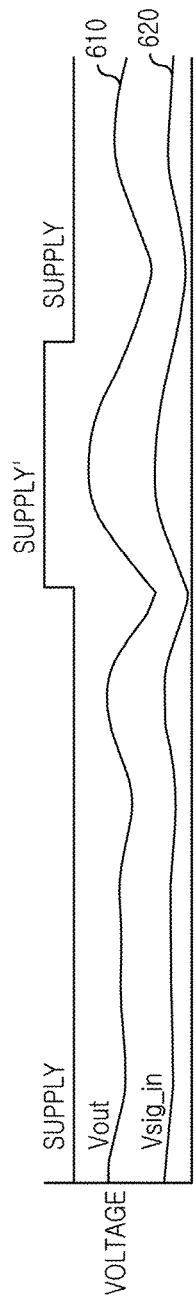
FIGS. 6A to 6D are diagrams illustrating an output signal of a switch driver according to an exemplary embodiment of the present invention.
Figure 6B:
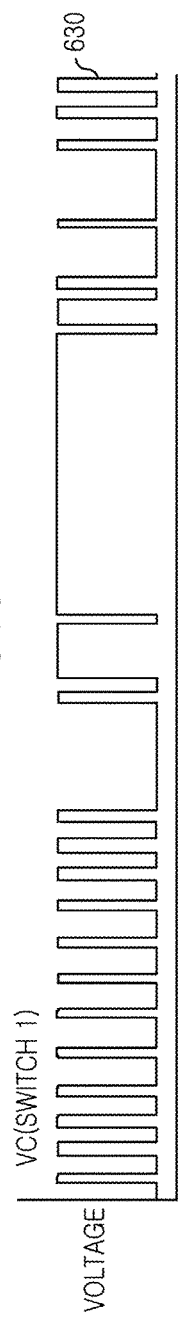
Figure 6C:
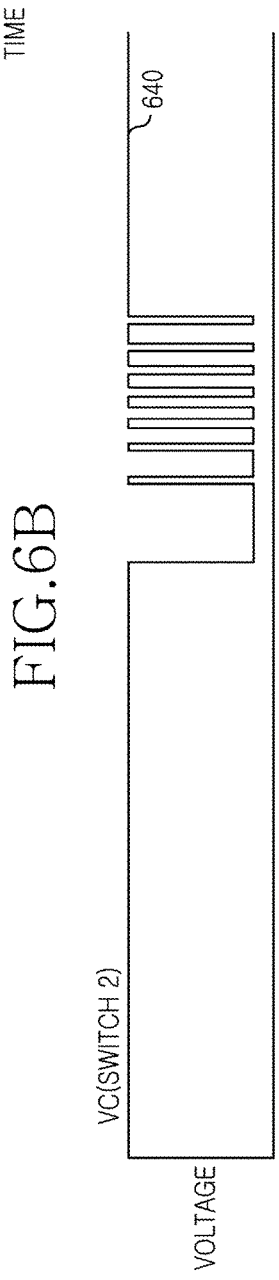
Figure 6D:
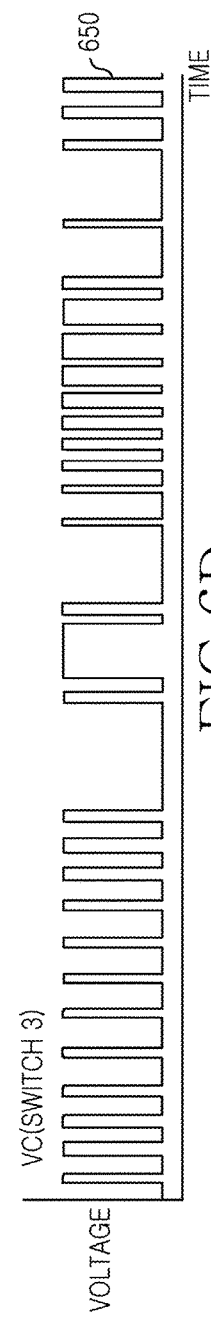

Referring to FIGS. 6A to 6D, when the hybrid power supply modulator generates and outputs a supply voltage 610 of the power amplifier according to a voltage 620 of an input signal, as illustrated in FIG. 6A, then the switch driver 430 controls the switch transistors 421, 422 and 423 according to the output signal of the SMPS module 420 and the input signal of the SMPS module 420 as illustrated in FIGS. 6B, 6C and 6D. Herein, the voltage 620 of the input signal illustrated in FIG. 6A is a voltage prior to being equalized to a level of the output voltage in the input circuit 228.

As illustrated in FIG. 6B, the switch driver 430 turns off the first switch transistor 421 when the voltage 620 of the input signal of the SMPS module 420 is higher than the reference voltage to produce an output 630. Also, when the voltage 620 of the input signal of the SMPS module 420 is lower than or equal to the reference voltage, the switch driver 430 controls the on/off of the first switch transistor 421 according to an output value of the comparator 428.

As illustrated in FIG. 6C, the switch driver 430 turns on the second switch transistor 422 only when the voltage 620 of the input signal of the SMPS module 422 is higher than the reference voltage in order to produce an output 640. In this case, the switch driver 420 controls the on/off of the second switch transistor 422 according to the output value of the comparator 428 during a period while the second switch transistor 422 can be driven. As illustrated in FIG. 6D, the switch driver 430 controls the third switch transistor 423 according to the output value of the comparator 428 to produce the output 650.

As described above, when the voltage 620 of the input signal of the SMPS module 420 is higher than the reference voltage, the SMPS module 420 of the hybrid power supply modulator uses the external power supply having a higher voltage than the internal power supply. In this case, since a difference of the voltage applied across the inductor 426 of the SMPS module 420 increases, a change rate of a current of the inductor 426 increases by the difference of the voltage applied across the inductor 426. Accordingly, the SMPS module 420 may generate the current needed in the power amplifier in a region where a voltage of the input signal is at its peak.

Figure 7A:
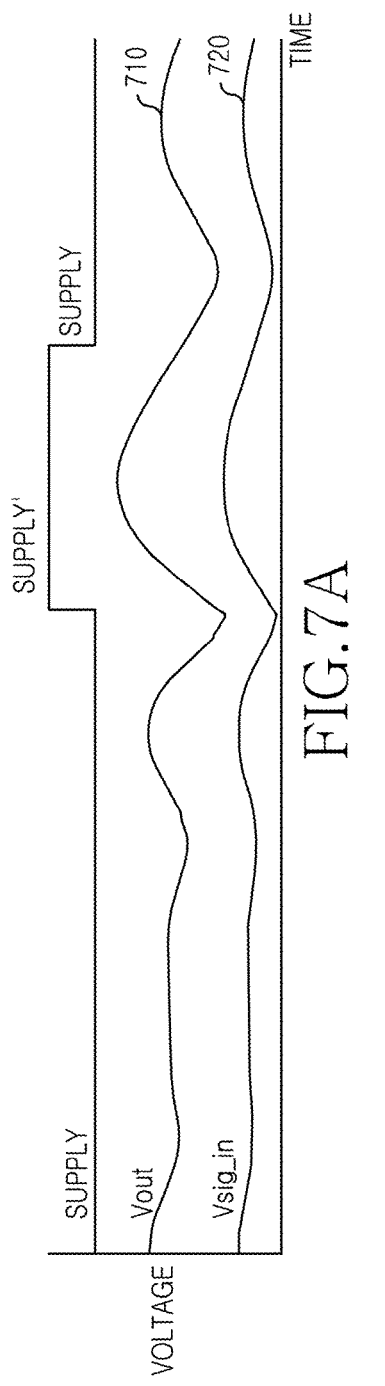
FIGS. 7A to 7C are diagrams illustrating a process for selecting a power supply to be used to generate a supply current of a power amplifier in a Switching Mode Power Supplier (SMPS) according to an exemplary embodiment of the present invention.
Figure 7B:
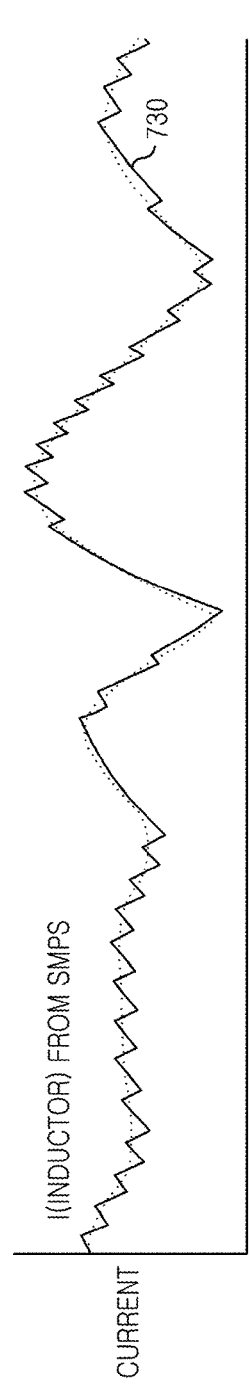
Figure 7C:
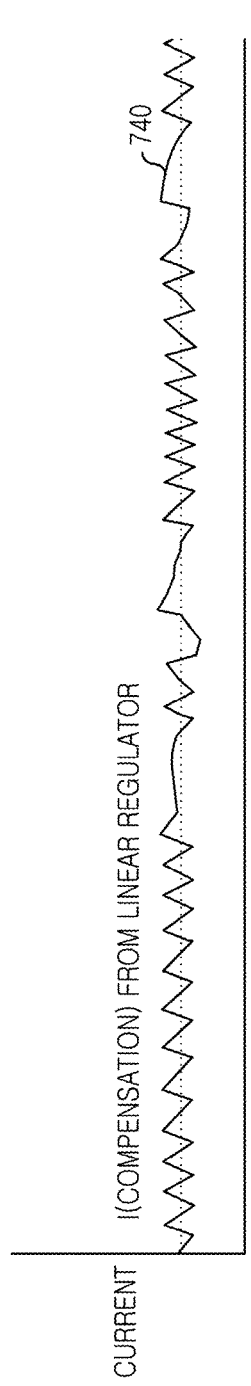

FIGS. 7A to 7C are diagrams illustrating a process for selecting a power supply to be used to generate a supply current of a power amplifier in a SMPS according to an exemplary embodiment of the present invention.

Referring to FIGS. 7A to 7C, in a case where the hybrid power supply modulator generates and outputs a supply voltage 710 of the power amplifier based on a voltage 720 of the input signal, as illustrated in FIG. 7A, then the switch driver 430 of the SMPS module 420 controls the switch transistors 421, 422 and 423 and selectively uses the power supplies to generate the current to be outputted to the power amplifier, as illustrated in FIGS. 7B, 7C and 7D. Herein, the voltage 720 of the input signal illustrated in FIG. 7A is a voltage prior to being equalized to a level of the output voltage in the input circuit 432.

In this case, when the voltage 720 of the input signal of the SMPS module 420 is lower than the reference voltage, the SMPS module 420 uses the internal power supply to supply most of the current 730 needed in the power amplifier, as illustrated in FIG. 7B. On the other hand, when the voltage 720 of the input signal of the SMPS module 420 is higher than the reference voltage, the SMPS module 420 uses the external power supply 424 to supply most of the current 730 needed by the power amplifier in a region where the voltage 720 of the input signal is at its peak, as illustrated in FIG. 7B. In this case, the linear regulator 410 outputs a small supplementary current component 740, as illustrated in FIG. 7C.

Figure 8:
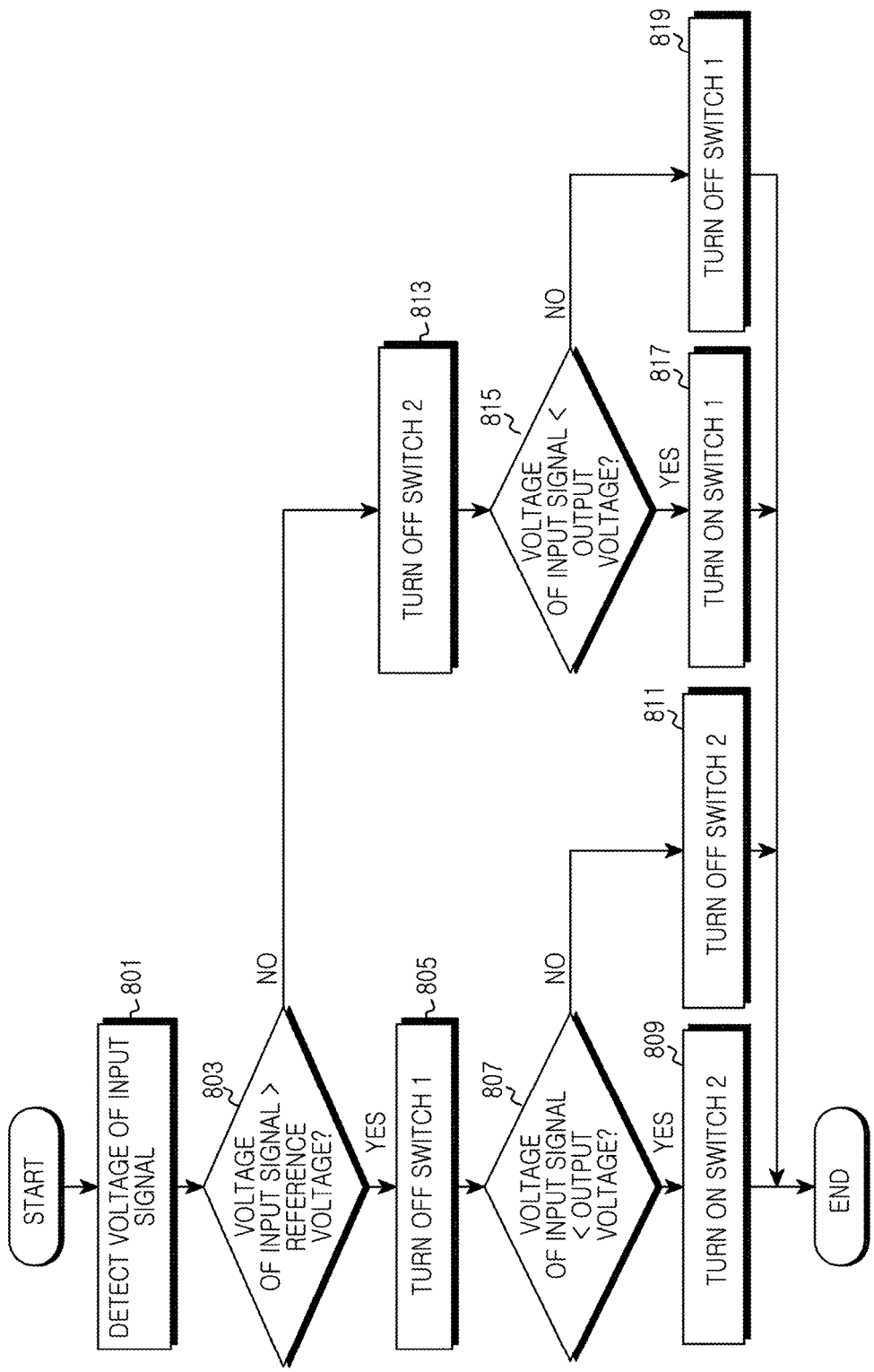
FIG. 8 is a diagram illustrating a performance change graph according to an exemplary embodiment of the present invention.

FIG. 8 illustrates a process for selecting a power supply to be used to generate a supply current of a power amplifier in an SMPS module according to an exemplary embodiment of the present invention.

Referring to FIG. 8, a description will be given of a method for selectively using the power supplies in the SMPS module 420. In step 801, the SMPS module of the hybrid power supply modulator detects a voltage of the input signal of the SMPS module. Next, in step 803, the SMPS module compares the voltage of the input signal with the reference voltage in order to determine whether to use the external power supply.

When, in step 803, the voltage of the input signal is higher than the reference voltage, the SMPS module determines that the external power supply is used to generate a current to be supplied to the power amplifier. Accordingly, in step 805, the SMPS module turns off the first switch transistor to be used in order to connect the internal power supply. For example, when the voltage of the input signal is higher than the reference voltage, the SMPS module determines that the voltage of the input signal is at its peak. Accordingly, the SMPS module determines that the external power supply having a higher voltage than the internal power supply is used to increase a change rate of a current by increasing a difference of the voltage applied across the inductor.

Next, in step 807, the SMPS module compares the voltage of the output signal of the SMPS module with the voltage of the input signal of the SMPS module in order to determine a time point at which the external power supply is to be used. When the voltage of the output signal of the SMPS module is higher than the voltage of the input signal of the SMPS module, the SMPS module proceeds to step 809. In step 809, the SMPS module turns on the second switch transistor to connect the external power supply to the inductor. On the other hand, at step 807, when the voltage of the output signal of the SMPS module is smaller than or equal to the voltage of the input signal of the SMPS module, the SMPS module proceeds to step 811. In step 809, the SMPS module turns off the second switch transistor to disconnect the external power supply from the inductor.

On the other hand, in step 803, when the voltage of the input signal is lower than or equal to the reference voltage, then the SMPS module determines that the internal power supply is used to generate a current to be supplied to the power amplifier. Accordingly, in step 813, the SMPS module turns off the second switch transistor to be used to connect the external power supply.

Next, in step 815, the SMPS module compares the voltage of the output signal of the SMPS module with the voltage of the input signal of the SMPS module in order to determine a time point at which the internal power supply is to be used.

When it is determined, in step 815, that the voltage of the output signal of the SMPS module is higher than the voltage of the input signal of the SMPS module, then the SMPS module proceeds to step 817. In step 817, the SMPS module turns on the first switch transistor to connect the internal power supply to the inductor. On the other hand, when it is determined, in step 815, that the voltage of the output signal of the SMPS module is smaller than or equal to the voltage of the input signal of the SMPS module, then the SMPS module proceeds to step 819. In step 819, the SMPS module turns off the first switch transistor to disconnect the internal power supply from the inductor. Thereafter, the SMPS module ends the present algorithm.

In the above exemplary embodiment of the present invention, the SMPS module compares a voltage of an input signal with a reference voltage in order to determine whether to use the external power supply or the internal power supply, and then compares the voltage of the output signal with the voltage of the input signal in order to determine a use period of the external power supply or the internal power supply.

In another exemplary embodiment of the present invention, the SMPS module may compare the voltage of the input signal with the reference voltage in order to determine a power supply to be used, and may continue to use the determined power supply until the result of comparison between the voltage of the input signal and the reference voltage is changed.

As described above, since the hybrid power supply modulator selectively uses the power supplies needed to generate the supply voltage according to an amplitude component of the input signal, a current supply capability of the SMPS may be improved. Also, even when the amplitude component of the input signal changes rapidly, the SMPS may supply most of the peak current in order to rapidly estimate a waveform of the input signal.

Also, since the SMPS supplies most of the peak current, a load on the linear regulator may be reduced. Accordingly, a linear modulation efficiency of the power supply modulator may be improved, and a size of a pass transistor of the linear regulator may be reduced.

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the invention is defined not by the detailed description of the invention but by the appended claims, and all differences within the scope will be construed as being included in the present invention.

What is claimed is:

1. An apparatus for power supply modulation, the apparatus comprising:
   a switching mode power supplier (SMPS) module including:
      a feedback circuit configured to provide a previous output signal from an output of the SMPS module; and
      a switch driver configured to:
         turn off a first switch connected to a first power supply in the SMPS module and a second switch connected to a second power supply when a voltage of an input signal of the apparatus is lower than or equal to a voltage of the previous output signal;
         identify a power supply among the first power supply and the second power supply when the voltage of the input signal of the apparatus is higher than the voltage of the previous output signal; and
         control to generate an output signal for supplying a power to a power amplifier by using the identified power supply when the voltage of the input signal of the apparatus is higher than the voltage of the previous output signal; and
   a linear regulator coupled to the output of the SMPS module, configured to supplement or sink a current of the output signal,
   wherein the identified power supply is the first power supply when the voltage of the input signal is lower than or equal to a reference voltage,
   wherein the identified power supply is the second power supply when the voltage of the input signal is higher than the reference voltage, and
   wherein the second power supply provides a higher voltage than the first power supply.

2. The apparatus of claim 1,
   wherein the SMPS module comprises:
      a plurality of switch transistors operatively connected between a low-pass filter and each of the first power supply and the second power supply;
      a comparator configured to generate a first control signal by comparing the voltage of the input signal and the voltage of the previous output signal;
      a detector configured to generate a second control signal by comparing the voltage of the input signal and the reference voltage,
   wherein the switch driver is further configured to:
      identify the power supply based on the first control signal and the second control signal, and
      determine whether each of the plurality of switch transistors turns on based on the power supply, and
   wherein the low-pass filter configured to generate the output signal by filtering a signal received from at least one switch which is turned on among the plurality of switch transistors.

3. The apparatus of claim 2,
   wherein the low-pass filter comprises an inductor and a capacitor,
   wherein the feedback circuit is coupled to the low-pass filter, and
   wherein the voltage of the previous output signal and the voltage of the output signal is a voltage by the capacitor.

4. The apparatus of claim 1,
   wherein the second power supply comprises a power supply controller configured to generate the higher voltage than the first power supply, and
   wherein the input signal of the apparatus is provided to the SMPS module and the linear regulator.

5. The apparatus of claim 4, wherein the power supply controller includes at least one of a switching type direct current-direct current (DC-DC) converter and a charge pump type DC-DC converter.

6. A method for operating a power supply modulator including a switching mode power supplier (SMPS) module and a linear regulator, the method comprising:
   when a voltage of an input signal of the apparatus is lower than or equal to a voltage of a previous output signal provided by a feedback circuit in the SMPS module, turning off a first switch connected to a first power supply in the SMPS module and a second switch connected to a second power supply, the previous output signal provided from an output of the SMPS module;
   when the voltage of the input signal of the apparatus is higher than the voltage of the previous output signal, identifying a power supply among the first power supply and the second power supply;
   when the voltage of the input signal of the apparatus is higher than the voltage of the previous output signal; and
   generating an output signal for supplying a power to a power amplifier by using the identified power supply, wherein the identified power supply is the first power supply when the voltage of the input signal of the apparatus is lower than or equal to a reference voltage, wherein the identified power supply is the second power supply when the voltage of the input signal is higher than the reference voltage, wherein the second power supply provides a higher voltage than the first power supply, and wherein a current of the output signal is supplemented or sunken by the linear regulator coupled to the output of the SMPS module.

7. The method of claim 6, further comprising:

generating a first control signal by comparing the voltage of the input signal and the voltage of the previous output signal; and generating a second control signal by comparing the voltage of the input signal and the reference voltage, wherein the power supply is identified based on the first control signal and the second control signal, and wherein generating the output signal comprises:
 determining whether each of a plurality of switch transistors turns on based on the identified power supply, and
 generating the output signal by filtering a signal received from at least one switch which is turned on among the plurality of switch transistors.

8. The method of claim 7, wherein identifying the power supply comprises:

identifying the power supply as the second power supply based on the second control signal for the second power supply, and turning on a second switch corresponding the second power supply.

9. The method of claim 7, wherein identifying the power supply comprises:

identifying the power supply as the first power supply based on the second control signal for the first power supply, and turning on the first switch corresponding the first power supply.

10. The method of claim 6, further comprising:

generating the higher voltage than the first power supply by a power supply controller in the second power supply, wherein the power supply controller includes at least one of a switching type DC-DC converter and a charge pump type DC-DC converter, and wherein the input signal of the apparatus is provided to the SMPS module and the linear regulator.

11. An apparatus for power supply modulation, the apparatus comprising:

a switching mode power supplier (SMPS) module generating a current for supplying a power to a power amplifier, the SMPS module comprising:
 a feedback circuit configured to provide a previous output signal from an output of the SMPS module;
 a detector configured to generate a control signal by comparing a voltage of an input signal of the apparatus and a reference voltage; and
 a switch driver configured to:
  turn off a plurality of switches connected to a plurality of power supplies when a voltage of an input signal of the apparatus is lower than or equal to a voltage of the previous output signal;
  identify a power supply among the plurality of power supplies based on the control signal when the voltage of the input signal is higher than the voltage of the previous output signal, and
  determine whether each of the plurality of switch transistors turns on based on the identified power supply when the voltage of the input signal is higher than the voltage of the previous output signal; and a linear regulator coupled to the output of the SMPS module, including a plurality of transistors and an amplifier for regulating a current amount generated by the plurality of transistors, wherein the plurality of switch transistors are connected between a filter and each of the plurality of power supplies, wherein the filter is configured to generate the current by filtering a signal having passed through at least one switch which is turned on among the plurality of the switch transistors;

wherein each of the plurality of power supplies provides a different voltage, and wherein the linear regulator is configured to regulate the current amount generated by the plurality of transistors by at least one of generating a source current for supplementing an insufficient amount of the current generated by the SMPS module by using a first transistor from among the plurality of transistors and generating a sink current for eliminating an excessive amount of the current generated by the SMPS module by using a second transistor from among the plurality of transistors.

12. The apparatus of claim 11, wherein the plurality of power supplies comprises:

a first power supply in the SMPS module; and a second power supply providing a higher voltage than the first power supply, wherein the filter includes an inductor and a capacitor.

13. The apparatus of claim 11, wherein the power supply controller comprises any one of a switching type direct current direct current (DC-DC) converter and a charge pump type DC-DC converter.

14. The apparatus of claim 1, wherein the SMPS module comprises:

the first switch to control to whether to provide the first power supply; and the second switch to control to whether to provide the second power supply.

15. The apparatus of claim 14, wherein the switch driver is further configured to turn on the second switch corresponding to the second power supply when the voltage of the input signal is higher than the reference voltage and when the voltage of the previous output signal of the SMPS module is higher than the voltage of the input signal.

16. The apparatus of claim 15, wherein the switch driver is further configured to turn on the first switch corresponding to first power supply when the voltage of the input signal is not higher than the reference voltage and when the voltage of the previous output signal of the SMPS module is higher than the voltage of the input signal.

17. The apparatus of claim 16, wherein the switch driver is further configured to turn off the first switch corresponding to the first power supply and the second switch corresponding to the second power supply when the voltage of the previous output signal of the SMPS module is not higher than the voltage of the input signal.

* * * * *